United States Patent
Boyer, III

[11] Patent Number: 5,878,579
[45] Date of Patent: Mar. 9, 1999

[54] HEAT TRANSFER PROBE

[76] Inventor: Lynn L. Boyer, III, 2202 Manassas Dr., Huntsville, Ala. 35803

[21] Appl. No.: 916,728

[22] Filed: Aug. 18, 1997

[51] Int. Cl.$^6$ .............................. F25B 21/02; F25D 3/00
[52] U.S. Cl. ................................ 62/3.3; 62/293
[58] Field of Search .................. 62/3.2, 3.3, 293, 62/3.62

[56] References Cited

U.S. PATENT DOCUMENTS

| | | | |
|---|---|---|---|
| 3,130,553 | 4/1964 | Makow | 62/293 |
| 3,133,539 | 5/1964 | Eidus | 62/3.3 |
| 3,146,600 | 9/1964 | Cox | 62/293 |
| 3,207,159 | 9/1965 | Tateisi | 62/3.3 |
| 3,289,749 | 12/1966 | Crump | 62/3.3 |
| 3,618,590 | 11/1971 | Frank et al. | 62/3.3 |
| 4,308,013 | 12/1981 | Major | 433/32 |
| 4,519,389 | 5/1985 | Gudkin et al. | 128/303.1 |
| 5,136,850 | 8/1992 | Bierschenk et al. | 62/3.62 |
| 5,277,030 | 1/1994 | Miller | 62/3.2 |
| 5,502,967 | 4/1996 | Nakagawa et al. | 62/3.3 |

Primary Examiner—William Doerrler
Attorney, Agent, or Firm—John C. Garvin, Jr.; Harold W. Hilton

[57] ABSTRACT

A device for heating or cooling a fluid. A heat transfer probe (tubular member) is insertable into the fluid to heat or cool the fluid. The tubular probe has a plurality of thermoelectric modules mounted in the wall thereof and the modules are in contact with air in the center of the tubular probe and with fluid in the container. Each module is comprised of mating N and P semiconductors. Heat or cooling is generated by the modules dependent on the direction of electrical current flow through the modules. Fins are bonded to the modules and extend into the ambient air in the tube to facilitate thermal transfer between the ambient air which flows across the modules in the tube. Fins are also bonded to the opposite side of the thermoelectric module and extend into the fluid to facilitate thermal transfer in the fluid.

12 Claims, 3 Drawing Sheets

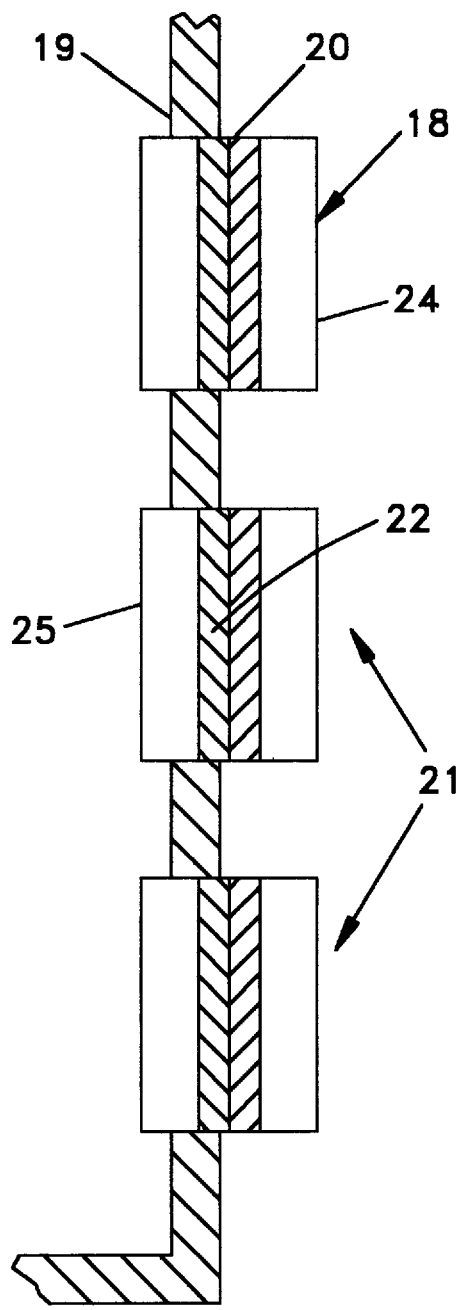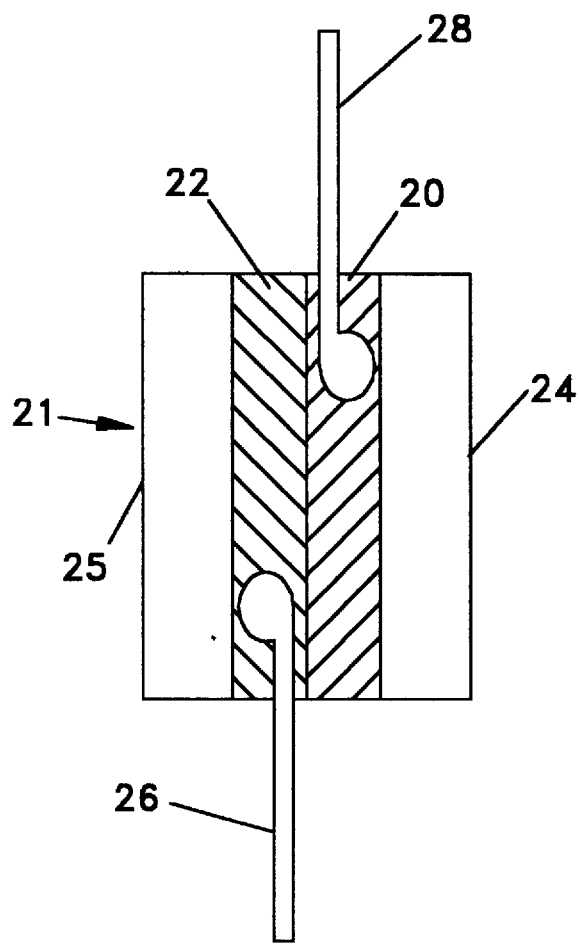
FIG. 2
FIG. 3

HEAT TRANSFER PROBE

FIELD OF THE INVENTION

The present invention relates to heat transfer elements and more particularly to a portable probe having thermoelectric modules mounted thereon for heating or cooling a fluid into which the probe is inserted.

BACKGROUND OF THE INVENTION

The need for a portable heat transfer mechanism manifests itself in numerous circumstances. Cool fluids are required by outside workers in desert environments and hot summer weather, conversely warm fluids are required by the same persons in cold environments and cold/freezing winter weather. Other applications include the need of home brewers to maintain a specific temperature range for their fermenting beer, home vintners for their fermenting wine. Most portable mechanical heating and cooling devices have inherent disadvantages. Heating devices usually operate at elevated temperatures and many require flammable fuel. Both can be extremely hazardous. Cooling mechanisms are bulky, heavy, mechanically complex and frequently employ materials designated as ozone depleting substances or otherwise environmentally adverse.

Thermoelectric modules (Peltier elements) based upon the Peltier effect, for heating and cooling, are well known in the art. Research and technical advances have been dramatically lowering the cost and broadening the applications for these devices. Small, portable food warmer/chillers powered from vehicle electrical systems, small air coolers, and cooling modules for electronic circuitry have been expanding areas of thermoelectric module application.

SUMMARY OF THE INVENTION

The present invention is directed to a portable probe or wand which is disposed for immersion into a fluid to heat or cool the fluid. The probe is a tubular member having thermoelectric modules mounted in the wall of the tube. The thermoelectric modules consist of a pair of semiconductors disposed in mating relation. The first semiconductor extends into the open space of the center of the tube and may be bonded to a heat transfer member, such as a fin, to facilitate heat transfer between the ambient air in the tubular member and the module. The second semiconductor extends from the exterior surface of the tubular member and into the fluid and may be provided with a heat transfer material, such as a fin, to facilitate heat transfer between the fluid and the thermoelectric module.

BRIEF DESCRIPTION OF THE DRAWINGS

FIG. 2 is an enlarged sectional view of a wall of the tubular probe having a plurality of thermoelectric modules secured thereto.

FIG. 3 is an elevational diagrammatic sectional view of a thermoelectric module and illustrates electrical leads to the semiconductors of the module.

DESCRIPTION OF THE PREFERRED EMBODIMENT

Figure 1:
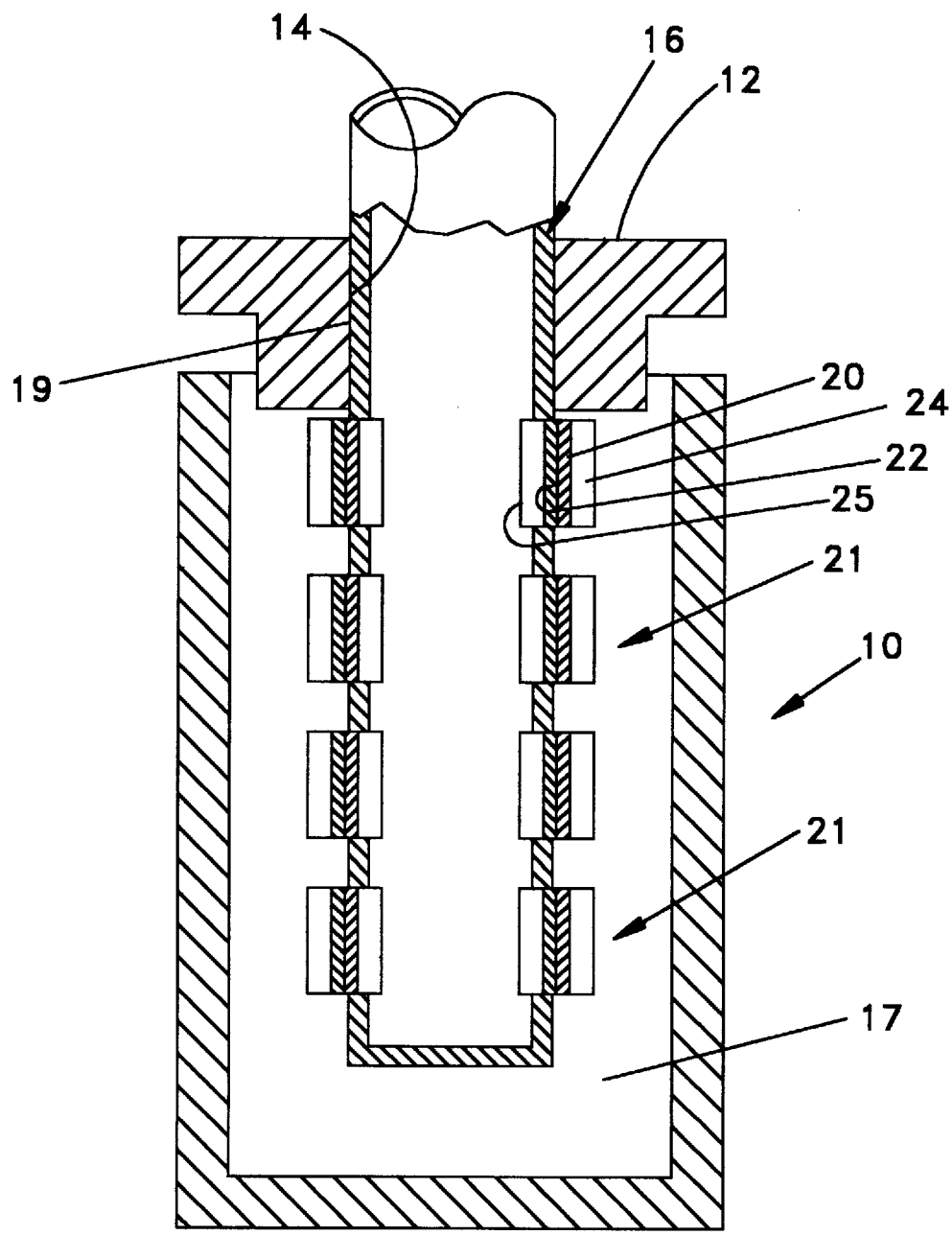
FIG. 1 is an exploded sectional view of a fluid container having the probe of the present invention immersed in fluid carried in the container. The probe is shown to be tubular and is provided with thermoelectric modules in the wall thereof.

As seen in FIG. 1, a fluid container 10 is shown to have a top 12 having an opening 14 through which a heat transfer tubular member or probe 16, built in accordance with the principles of the present invention, is inserted. Probe 16 is shown to have an open end and a closed end. The closed end of the probe extends into a fluid 17 carried in the container to heat or cool the fluid and includes a plurality of heat transfer modules 21 mounted in the wall of the tube. Probe 16 is shown to have an open end and a closed end.

FIG. 2 is a partial sectional enlarged view of wall 19 of the tubular probe and illustrates the mounting of heat transfer modules 21 therein. The probe 16 is shown to include an N semiconductor 20 in mating relation with an P semiconductor 22. Heat transfer fins 24 are secured to and extend away from semiconductor 20 and into the ambient air in tubular member 16. Fins 25 are secured to and extend away from semiconductor 22 and into fluid 17 in the container.

FIG. 3 is a diagrammatic elevational view of a single thermoelectric transfer module and illustrates the electrical connections to the semiconductors. As seen in FIG. 3, module 21 is configured as discussed above with the P and N semiconductors mounted together. Electrical leads 26 and 28 are respectively connected to the P and N semiconductors and are disposed for connection with a source of electric power.

Figure 4:
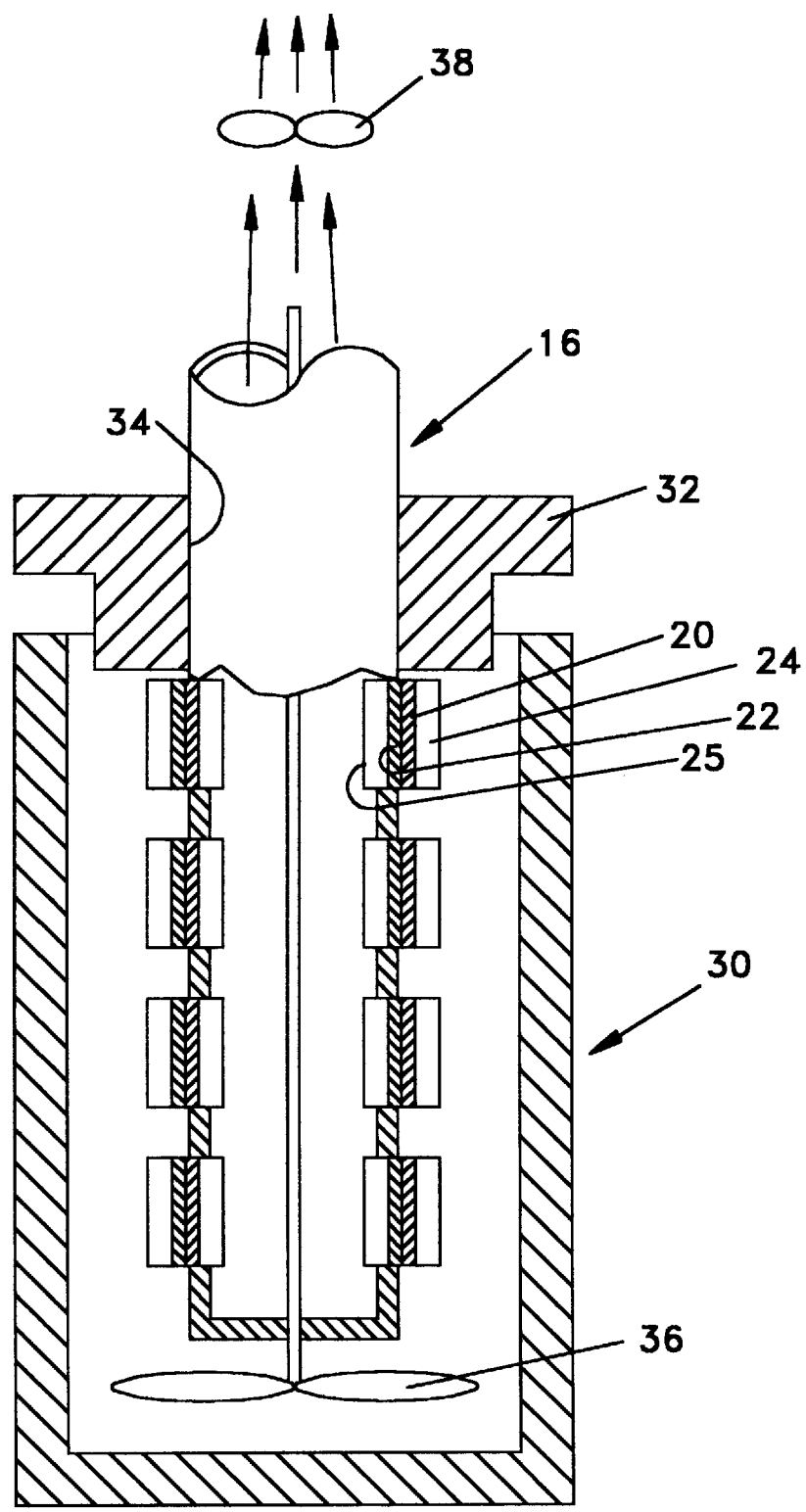
FIG. 4 is a view similar to FIG. 1 and illustrates the addition of a fan for circulating air over the thermoelectric elements of the probate and also a stirring mechanism for stirring the fluid in the container.

FIG. 4 is a diagrammatic view illustrating an embodiment of the present invention wherein a stirring mechanism 36 is provided to prevent the formation of thermoclines in the fluid and a fan 38 is provided to draw air in the tube across the interior fins 25 of the probe.

As seen in FIG. 4, a container 30 is shown to be provided with a top 32 having an opening 34 into which the heat transfer probe 16 of the present invention is inserted. The probe is shown to include N semiconductor 20, P semiconductor 22, and heat transfer fins 24 and 25 and is constructed as discussed above. The container 30 is shown to be provided with a fluid stirring mechanism 36 to prevent thermoclines in the fluid. A fan 38 is provided externally of the container to draw air across the interior fins of the probe.

The thermoelectric modules transfer heat (peltier effect) dependent upon the direction of current flow through the device. The module is constructed of N type and P type semiconductors electrically connected in series and as an electric current traverses the circuit, heat is absorbed at the cold junction and transferred to the hot junction of the circuit. the use of thermal transfer materials (fins) separately joined to the hot and cold junctions effectively transfers energy between the fluid and the ambient air.

It is to be understood that although the thermoelectric modules are described as heat transfer elements, it is only necessary to reverse the electrical current flow through to semiconductors to produce a structure in which the effect is reversed, i.e., the cool junction becomes warm and the hot junction becomes cool.

As will be apparent to one skilled in the art, various changes and numerous modifications of the disclosed structures and assemblies may be made without departing from the spirit of the invention, and all of such changes are contemplated as may come within the scope of the appended claims.

I claim:

1. A device for heating or cooling a fluid comprising:
   a tubular member having an open end for communication with ambient air and a closed end insertable into said fluid for heating or cooling of said fluid, said tubular member having at least one thermoelectric module carried in the wall thereof, said thermoelectric module having a first section extending into the ambient air within the interior of said tubular member and a second section extending exteriorly of said tubular member for immersion in said fluid.

2. A device as in claim 1 wherein said thermoelectric module includes a pair of semi-conductors disposed in mating relation and connected to a source of electrical power to produce the peltier effect.

3. A device as in claim 2 including first thermal transfer fin means attached to a first of said semiconductors and extending into the ambient air within the interior of said tubular member.

4. A device as in claim 3 including second thermal transfer fin means attached to the second of said pair of semiconductors and extending into said fluid.

5. A device as in claim 1 including a plurality of thermoelectric modules carried in the wall of said tubular member.

6. A device for heating or cooling a fluid comprising:

a tubular member having a first end for communication with ambient air and a closed end insertable into said fluid for heating or cooling of said fluid, said tubular member having at least one thermoelectric module carried in the wall thereof, said thermoelectric module having a first section extending into the ambient air within the interior of said tubular member and a second section extending into said fluid;

said thermoelectric module including a pair of semi-conductors disposed in mating relation and connected to a source of electrical power to produce the peltier effect;

first thermal transfer fin means attached to a first of said semiconductors and extending into the ambient air within the interior of said tubular member; and a container for carrying said fluid therein, said container including a removable lid having an opening to receive said probe therein.

7. A device as in claim 6 including stirring means carried in said container for stirring the fluid to prevent thermoclines in the fluid.

8. A device as in claim 7 including a fan to draw air across said first thermal transfer fin means.

9. A device as in claim 5 including first thermal fin means secured to a first of a plurality of said modules and extending into the interior of said tubular member.

10. A device as in claim 9 including second thermal transfer fin means secured to a second plurality of said modules and disposed for extending into said fluid.

11. A device as in claim 1 wherein said probe is portable.

12. A device as in claim 5 wherein said probe is portable.

* * * * *